(12) United States Patent
Viger et al.

(10) Patent No.: US 8,819,532 B2
(45) Date of Patent: Aug. 26, 2014

(54) METHODS AND DEVICES FOR TRANSMITTING A DATA STREAM AND CORRESPONDING COMPUTER READABLE MEDIA

(75) Inventors: Pascal Viger, Janze (FR); Julien Sevin, Saint Aubin du Cormier (FR)

(73) Assignee: Canon Kabushiki Kaisha, Tokyo (JP)

( * ) Notice: Subject to any disclaimer, the term of this patent is extended or adjusted under 35 U.S.C. 154(b) by 1021 days.

(21) Appl. No.: 12/878,753

(22) Filed: Sep. 9, 2010

(65) Prior Publication Data

US 2011/0060974 A1    Mar. 10, 2011

(30) Foreign Application Priority Data

Sep. 10, 2009   (FR) ..................................... 09 04325

(51) Int. Cl.
| | | |
|---|---|---|
| *G06F 11/10* | (2006.01) | |
| *H04L 1/00* | (2006.01) | |
| *G06F 11/20* | (2006.01) | |
| *H03M 13/11* | (2006.01) | |
| *H03M 13/13* | (2006.01) | |

(52) U.S. Cl.
CPC .............. *G06F 11/10* (2013.01); *H04L 1/0057* (2013.01); *G06F 11/1076* (2013.01); *H03M 13/116* (2013.01); *H03M 13/118* (2013.01)
USPC ...................................................... 714/800

(58) Field of Classification Search
CPC ... G06F 11/10; G06F 11/1076; H04L 1/0057; H03M 13/116; H03M 13/118
See application file for complete search history.

(56) References Cited

U.S. PATENT DOCUMENTS

| | | | | |
|---|---|---|---|---|
| 5,282,204 | A * | 1/1994 | Shpancer et al. | 370/341 |
| 7,734,993 | B2 * | 6/2010 | Krachkovsky et al. | 714/801 |
| 8,037,398 | B2 * | 10/2011 | Argon et al. | 714/803 |
| 8,230,314 | B1 * | 7/2012 | Feng et al. | 714/800 |
| 8,386,901 | B2 * | 2/2013 | Piret et al. | 714/800 |
| 8,477,811 | B2 * | 7/2013 | Kitazoe | 370/503 |
| 8,533,577 | B1 * | 9/2013 | Feng et al. | 714/800 |
| 8,582,685 | B2 * | 11/2013 | Belotserkovsky | 375/295 |
| 8,635,515 | B1 * | 1/2014 | Yeo et al. | 714/785 |
| 2007/0008884 | A1 * | 1/2007 | Tang | 370/230 |
| 2008/0159325 | A1 * | 7/2008 | Chen et al. | 370/432 |

FOREIGN PATENT DOCUMENTS

EP        2020799 A1    2/2009

OTHER PUBLICATIONS

Cidon, Israel et al., "Hybrid TCP-UDP Transport for Web Traffic," Performance, Computing and Communications Conference, 1999 IEEE, pp. 177-184.

* cited by examiner

*Primary Examiner* — Andrew Lai
*Assistant Examiner* — Hoyet H Andrews
(74) *Attorney, Agent, or Firm* — Canon USA, Inc., IP Division

(57) ABSTRACT

A data stream is transmitted from a transmitting device to a receiving device via a communication network. Data of the data stream is transmitted to the receiving device by using a transport protocol without data acknowledgement. In a transmission method, parity-encoding parameters for parity encoding a data set of the data stream is determined via the transmitting device. The transmitting device also generates parity data from the data set by using the determined parity-encoding parameters. The transmitting device further transmits the generated parity data to the receiving device via the communication network by using a transport protocol with data acknowledgement.

18 Claims, 9 Drawing Sheets

METHODS AND DEVICES FOR TRANSMITTING A DATA STREAM AND CORRESPONDING COMPUTER READABLE MEDIA

CROSS-REFERENCE TO RELATED APPLICATIONS

This application claims the benefit under 35 U.S.C. §119 (a)-(d) of French Patent Application No. 09 04325 filed on Sep. 10, 2009 and entitled "Methods and devices for transmitting a data stream, corresponding computer program product and corresponding storage means".

The above cited patent application is incorporated herein by reference in its entirety.

BACKGROUND OF THE INVENTION

1. Field of the Invention

The present invention relates to a method and a device for transmitting a data stream, a computer program which causes a computer or processor to carry out the transmission method when it is executed, and an information storage means storing the program.

The invention lies in the technical field of communication networks.

The present invention finds a particular application in the use of communication tunnels for the creation of virtual private networks via the Internet network.

2. Description of the Related Art

The technology of VPN (for "Virtual Private Network") networks offers a valuable solution for communicating transparently in real time and continuously, in a secure manner between individuals sharing one centre of interest while using the Internet network infrastructure which is not very secure but cheap.

For communicating transparently and dispensing with addresses that cannot be routed, VPN networks use a particular encapsulation (called "tunnelling") using a communication tunnel. This operation consists in encapsulating a layer A protocol (called the onboard or transported or passenger protocol) in a layer B protocol (called the transport or carrying protocol) by virtue of an encapsulation protocol C. Therefore, the transport protocol B treats the onboard protocol A as payload data.

FIG. 3, described in detail below, shows an example of packet encapsulation in a layer-2 VPN network. The onboard protocol A is a protocol of the $2^{nd}$ layer ("layer-2") of the OSI model. The term layer-2 tunnel is also used.

Such communication tunnels are used to interconnect two Local Area Network ("LANs") in order to create a virtual LAN network comprising the original two LANs.

An illustration of a VPN network configuration based on a tunnelling technology is illustrated in FIG. 1 (described in detail below). The tunnel is established between two tunnel end points ("TEPs"), and each packet (also called a frame) originating from a first LAN 103 is sent to a second LAN 104 after having been encapsulated by the tunnel end point 101 situated on the first LAN 103; the tunnel end point 102 on the second LAN 104 receives the packet via the tunnel, decapsulates the packet and sends it to the second LAN 104. From the point of view of the pieces of equipment 108-113 connected to each of the first and second LANs, these pieces are virtually connected to one and the same LAN. In this example, the tunnel end points 101 and 102 are not incorporated into the gateways 105 and 106.

Patent application publication EP 2 020 799 describes a VPN network comprising several carriers, each of these carriers using a distinct transport protocol. In the present description, this type of tunnel will be called a multi-transport tunnel. Each tunnel end point then has a set of carriers with distinct characteristics. In order to transmit data from one LAN to the other LAN, it is necessary to adapt the transmission to the application needs and to the changes in transmission conditions on the Internet network. EP 2 020 799 describes a tunnel preferably consisting of a TCP ("Transmission Control Protocol") carrier and a UDP ("User Datagram Protocol") carrier. The TCP protocol is a transmission protocol with Automatic Repeat Request ("ARQ") which is based on congestion and retransmission control mechanisms and thereby ensures the delivery of each packet to the destination. The UDP protocol is a protocol that is much simpler to use and faster, which does not take account of the order of the frames and supports no acknowledgement.

The UDP protocol then allows delivery of the data with a controlled latency, but with no guarantee with respect to data loss. In a tunnel, the UDP carrier is therefore used to convey data (passenger stream) with a high time constraint, such as for example audiovisual data. These audiovisual data are for example transmitted over a LAN according to the RTP ("Real-Time Transport Protocol", as defined by the RFC-3550 standard) protocol. Such data cannot be transmitted via the TCP carrier of the tunnel because, in the event of a high error rate on the Internet network, the TCP carrier would generate many packet retransmissions in order to ensure the delivery of the data to the other tunnel end point. Such a behaviour is catastrophic for the end-to-end latency of the transported RTP stream. In addition, it should be noted that the flow control and the congestion control mechanisms used by the TCP protocol cause, according to the variation in network load, sharp variations in the data transmission rate.

Controlling the end-to-end transmission latency, while remaining robust with respect to data loss, has a very significant influence on the Quality of Experience ("QoE") perceived by the user. Specifically, the slightest interruption in the transmission of the stream (that is to say a loss on the UDP carrier of the tunnel, a delay of the TCP carrier leading to obsolescence of the transported data) results in a degradation of the passenger stream. This results, for example, at the user level, in a break in the music clip listened to or in the video displayed.

There is no satisfactory transport method suitable for real time multimedia applications ("streaming") making it possible to maintain the quality (QoE) perceived by the user despite the variations in transmission conditions in the context of using VPN networks.

The RFC-2198 standard ("RTP Payload for Redundant Audio Data") proposes to insert into an RTP stream redundant copies of audio data that are present in this RTP stream, so that the receiver of the stream can correct the disruptions associated with losses caused during the transport of the RTP stream. The RFC-2198 standard therefore proposes to apply an FEC (for "Forward Error Correction") mechanism, that is to say an error-correcting code (or parity code), in order to combat packet losses during transmission. Therefore, each RTP packet contains an item of audio data for a given time slot, and a copy (more compressed) of the audio data of a preceding time slot. This allows the approximate recomposition of the audio samples lost based on the decoding of the next packet. However, this solution creates a large overoccupation ("overhead") of the bandwidth in order to transport the duplicate data; and is therefore more suitable for WLAN ("Wireless Local Area Network") environments that are subjected to data losses than for WAN ("Wide Area Network") environments where the nondelivery of a packet results from congestion on the transmission path. Specifically, in WAN environments, such a solution may make congestion phenomena encountered on the transmission path even worse.

Redundancy of the information only aggravates the congestion phenomenon on the global WAN network where the bandwidth is limited.

BRIEF SUMMARY OF THE INVENTION

In at least one embodiment, a notable object of the invention is to alleviate these various disadvantages of the prior art.

One particular object of the invention is to maintain the quality (QoE) perceived by the user in the context of transmission of a data stream (for example of the multimedia type), despite the variations in transmission conditions.

Another object of the invention is to supply a "quality and latency"-oriented class of transport service in an VPN network environment, that is to say which allows a reliable and fast delivery of a multimedia stream.

Another object of at least one embodiment of the invention is to supply such a technique that makes it possible to minimize the undesirable effects on other streams being transmitted.

Another object of at least one embodiment of the invention is to supply such a technique that makes it possible to limit the memory resources necessary in reception.

Another object of at least one embodiment of the invention is also to supply such a technique that is simple to apply and not very costly.

According to a first aspect, in at least one embodiment, the invention relates to a method for transmitting a data stream from a transmitting device to a receiving device via a communication network, the data of the data stream being transmitted to the receiving device by using a transport protocol without data acknowledgement. The method is such that the transmitting device carries out the steps of:

determining parity-encoding parameters for parity encoding a data set of said stream, according to an item of information concerning congestion of said communication network;

generating parity data from said data set by using said determined parity-encoding parameters;

transmitting the generated parity data to said receiving device via said communication network, by using a transport protocol with data acknowledgement.

Therefore, in at least one embodiment, the invention takes advantage of the slight latency of the transport protocol without data acknowledgement, such as the UDP protocol for example, and the robustness of the transport protocol with data acknowledgement, such as the TCP protocol for example.

Advantageously, the parity-encoding parameters are determined, according to an item of information concerning a congestion of said communication network.

Therefore, taking account of the state of transmission between the transmitting device and the receiving device to define the parity-encoding parameters, the additional bandwidth necessary to introduce redundancy for the purpose of increasing the robustness of transmission of the stream is controlled and does not amplify a phenomenon of data loss on the communication network.

Advantageously, said parity-encoding parameters are determined according to a congestion window of said transport protocol with data acknowledgement.

Therefore, the quantity of parity data transmitted using the transport protocol by acknowledgement is controlled so as not to disrupt other streams in progress on the communication network.

Preferably, the quantity of generated parity data from said parity-encoding parameters is equal to a margin remaining in said congestion window.

Thus, the remaining margin, therefore unused in the congestion window of the protocol by acknowledgement, is completely used in the transmission of parity data, providing a maximum of robustness to the transmission of the data stream, without degrading the transmission conditions over the communication network.

Advantageously, an encoding window is defined on said stream and one of said determined parity-encoding parameters corresponds to a selection of said data set amongst said encoding window.

Therefore, the quantity of parity data is controlled and may be made constant. An adjustment may then take place on the quantity of data of the stream used to generate (or encode) the parity data. This therefore makes it possible to partially strengthen, that is to say on only a portion of the data stream, the transmission of this data stream via the communication network. Therefore, the transmitting device is capable of reacting quickly to changes of transmission conditions over the communication network without having to adapt the encoding window, that is to say by controlling the quantity of parity data transmitted so as not to aggravate transmission conditions that are already disrupted.

According to one advantageous embodiment of the invention, the transmitting device supplies the receiving device with an indication of said encoding window and of the data of said encoding window used for generating said parity data.

Therefore, the receiving device is informed of the modifications made by the transmitting device. This therefore allows the receiving device to react in a synchronized manner with the transmitting device to the changes in transmission conditions on the communication network, without the encoding window being modified, that is to say while controlling the quantity of parity data transmitted so as not to aggravate transmission conditions that are already disrupted.

Advantageously, the transmitting device carries out steps of:

determining a value of margin remaining in a congestion window of said transport protocol with acknowledgement;

adjusting the size of said encoding window according to the determined value of remaining margin.

The value of the remaining margin is for example determined by virtue of a value of a congestion window of a session using the protocol with data acknowledgement and a value of data rate transmitted by the transmitting device using this session.

Advantageously, the size of said encoding window is also modified according to a change in the transmission loss rate between the transmitting device and the receiving device.

Therefore, if the conditions of transmission between the transmitting device and the receiving device improve, the redundancy provided by the parity data can be reduced.

Advantageously, the method also comprises the steps of:

determining new parity-encoding parameters of said data set of said stream, according to a new item of information concerning congestion of said communication network;

generating parity data from said data set by using previous parity-encoding parameters.

In addition, if a new quantity of parity data resulting from the generating according to the new parity-encoding parameters is smaller than a previous quantity of parity data resulting from a generating according to the previous parity-encoding parameters, the method also comprises the steps of:

selecting generated parity data according to said previous parity-encoding parameters for a quantity equal to said new quantity of parity data;

transmitting said selected data to said receiving device via said communication network, by using said transport protocol with data acknowledgement.

Therefore, this prevents unnecessarily modifying the parity-encoding parameters and having to reconfigure the encoding module making it possible to generate the parity data. This is particularly advantageous if the transmission conditions have improved for a short period. In addition, the application of the previous parity-encoding parameters according to the method of the invention makes it possible to maintain the robustness necessary for communication while making it possible to determine the change in transmission conditions so as to be able to evaluate the necessity of switching to new parity-encoding parameters.

Preferably, the step of generating said parity data comprises one of the steps of the following group:

applying a Reed-Solomon correcting code to said selected set;

applying an exclusive-or operation to the data of said selected set.

Therefore, the invention can be applied with various error-correcting codes in order to encode the parity data, like the most common, such as a Reed-Solomon code, or the simplest, such as a code based on the use of EXCLUSIVE-Ors (XORs).

Preferably, a tunnel is used between the transmitting device and the receiving device, the data of said stream are transported via a carrier without acknowledgement of said tunnel, and the parity data are transported via a carrier with acknowledgement of said tunnel.

Therefore, a tunnel end point may apply the invention in order to manage, with a reduced latency and a robustness of transmission at a controlled cost (in terms of transmission resources), data-stream transmissions between two LAN networks.

In addition, the invention relates to a method for transmitting a data stream from a transmitting device to a receiving device via a communication network, the data of said data stream being transmitted to the receiving device by using a transport protocol without data acknowledgement. The method is such that said receiving device performs the steps of:

obtaining parity-encoding parameters (K, M) of a data set of said stream;

receiving parity data via said communication network, by using a transport protocol with data acknowledgement;

obtaining said data set from data of said data stream received by using the transport protocol without data acknowledgement and the parity data received by using the transport protocol with data acknowledgement.

Therefore, in at least one embodiment, the invention benefits from the low latency of the transport protocol without data acknowledgment, such as the protocol UDP for instance, as well as from the robustness of the transport protocol with data acknowledgment, such as the protocol TCP for instance, in order to allow the reconstruction of the data stream.

According to a second aspect, in at least one embodiment, the invention relates to a transmitting device for transmitting a data stream to a receiving device via a communication network, the data of said data stream being transmitted to the receiving device by using a transport protocol without data acknowledgement. In addition, the transmitting device comprises:

means for determining parity-encoding parameters for parity encoding a data set of said stream;

means for generating parity data from said data set by using said determined parity-encoding parameters;

means for transmitting the generated parity data to said receiving device via said communication network, by using a transport protocol with data acknowledgement.

Advantageously, the parity-encoding parameters are determined, according to an item of information concerning a congestion of said communication network.

Therefore, taking account of the state of transmission between the transmitting device and the receiving device to define the parity-encoding parameters, the additional bandwidth necessary to introduce redundancy for the purpose of increasing the robustness of transmission of the stream is controlled and does not amplify a phenomenon of data loss on the communication network.

Preferably, a tunnel is used between the transmitting device and the receiving device and the transmitting device comprises:

means for transmitting the data of said stream via a carrier of said tunnel using said transport protocol without data acknowledgement;

means for transmitting the parity data via a carrier of said tunnel using the transport protocol with data acknowledgement.

According to a third aspect, in at least one embodiment, the invention relates to a receiving device for receiving a data stream from a transmitting device via a communication network, the data of said data stream being transmitted to the receiving device by using a transport protocol without data acknowledgement. In addition, the receiving device comprises:

means for obtaining parity-encoding parameters (K, M) of a data set of said stream;

means for receiving parity data via said communication network, by using a transport protocol with data acknowledgement;

means for obtaining said data set from data of said data stream received by using the transport protocol without data acknowledgement and the parity data received by using the transport protocol with data acknowledgement.

According to a fourth aspect, in at least one embodiment, the invention relates to a computer program product that can be downloaded from a communication network and/or stored on a computer-readable medium and/or executable by a processor. This computer program product comprises instructions for applying the aforementioned method (in any one of its various embodiments), when said program is executed on a computer.

According to a fifth aspect, the present invention also proposes a storage means storing a computer program comprising a set of instructions that can be executed by a computer for applying the aforementioned method (in any one of its various embodiments), when the stored information is read by the computer.

In one embodiment, this storage means is totally removable.

The particular features and advantages of this transmitting device, of this receiving device, of this computer program product and of this information storage means, since they are similar to those of the corresponding data transmission methods, are not repeated here.

DETAILED DESCRIPTION OF THE INVENTION

In the following description, examples of the method and the device according to the invention are more fully described in the context of an application of a communication tunnel between two LANs, in order to interchange multimedia data. Nevertheless, the application of the present invention is in no way limited to this application scenario. Specifically, the present invention applies in a general manner to any transmission of a real time data stream (or "streaming") from a first device (transmitter or transmitting device) to a second device (receiver or receiving device).

Figure 1:
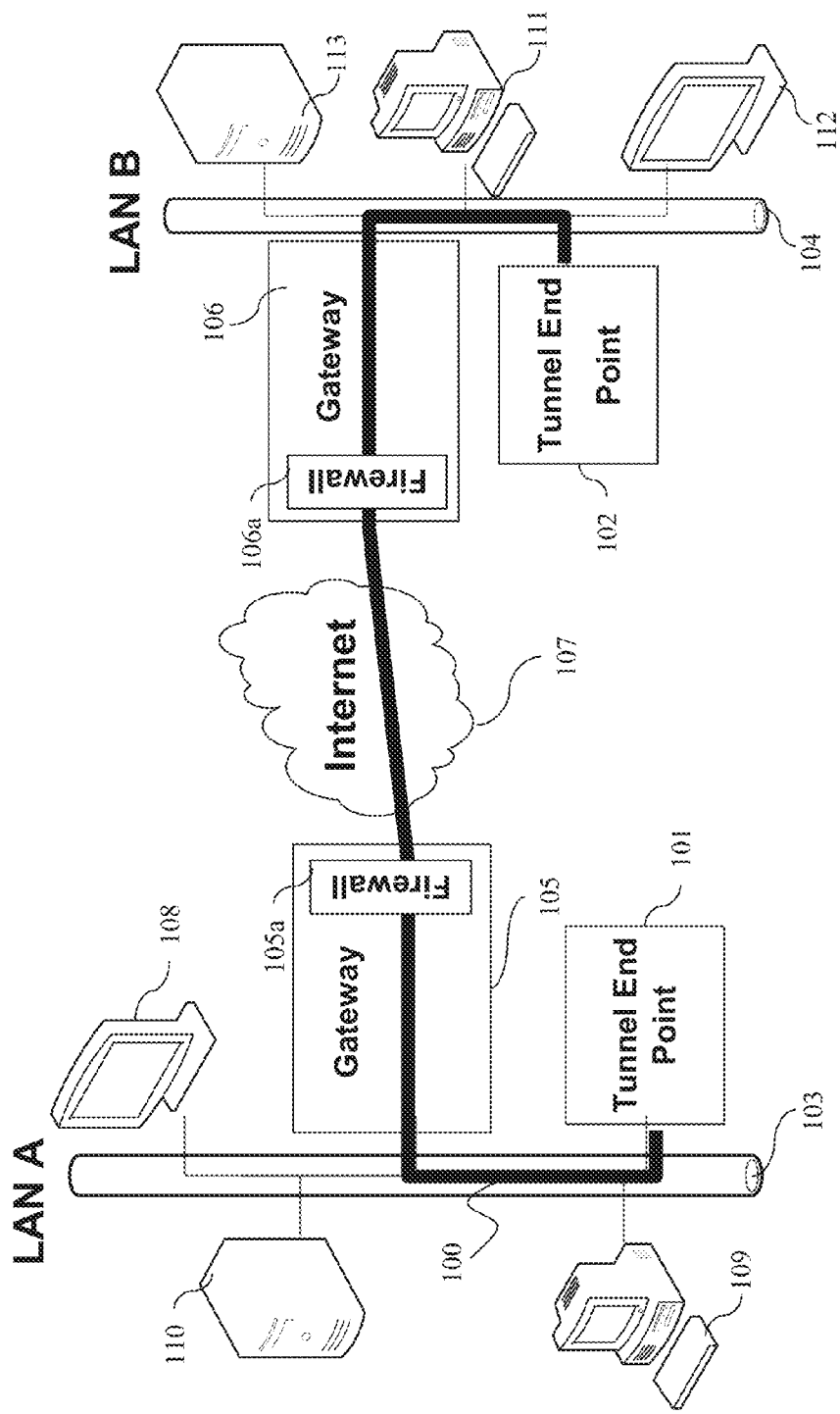
FIG. 1 illustrates schematically a configuration of a virtual private network (VPN) using a communication tunnel.

FIG. 1 illustrates schematically a configuration of a virtual private network (VPN) using a communication tunnel (also more simply called a "tunnel").

A tunnel 100 is established between a first tunnel end point 101 and a second, remote tunnel end point 102 via a communication network 107, such as the Internet for example. The tunnel 100 interconnects a LAN A 103 and another LAN B 104. Each of the LANs 103 and 104 comprises an item of high-speed Internet access equipment (home gateway) 105 or 106. Each gateway may incorporate a firewall 105a or 106a. Each LAN 103 and 104 also comprises equipment of the computer (or "PC" for "Personal Computer") type 109 or 111, a server 110 or 113 allowing the storing and sharing of digital multimedia data (audio, video, photo), and digital data retrieval equipment 108 or 112.

A tunnel end point may be an item of dedicated equipment (as shown in FIG. 1), or may be incorporated into an item of audiovisual equipment, such as for example a digital television set. It is also possible for the PC 109 or 111 to implement the functions of a tunnel end point by hardware and/or software.

Once the tunnel 100 is established, the equipment 108, 109 and 110, connected to LAN A 103, is capable of communicating with the equipment 111, 112 and 113, connected to LAN B 104. For example, the client equipment 108 connected to LAN A 103 can communicate transparently with the server 113 connected to LAN B 104.

FIG. 1 shows a communication network with only one tunnel, but it is well understood that one and the same LAN may comprise plural tunnel end points and/or that one and the same tunnel end point may manage plural tunnels (to respective further tunnel end points) in order to interconnect a first LAN to plural other LANs. In addition, for the purposes of simplification, the infrastructure equipment (routers, etc.) of the Internet network has not been shown.

Figure 2:
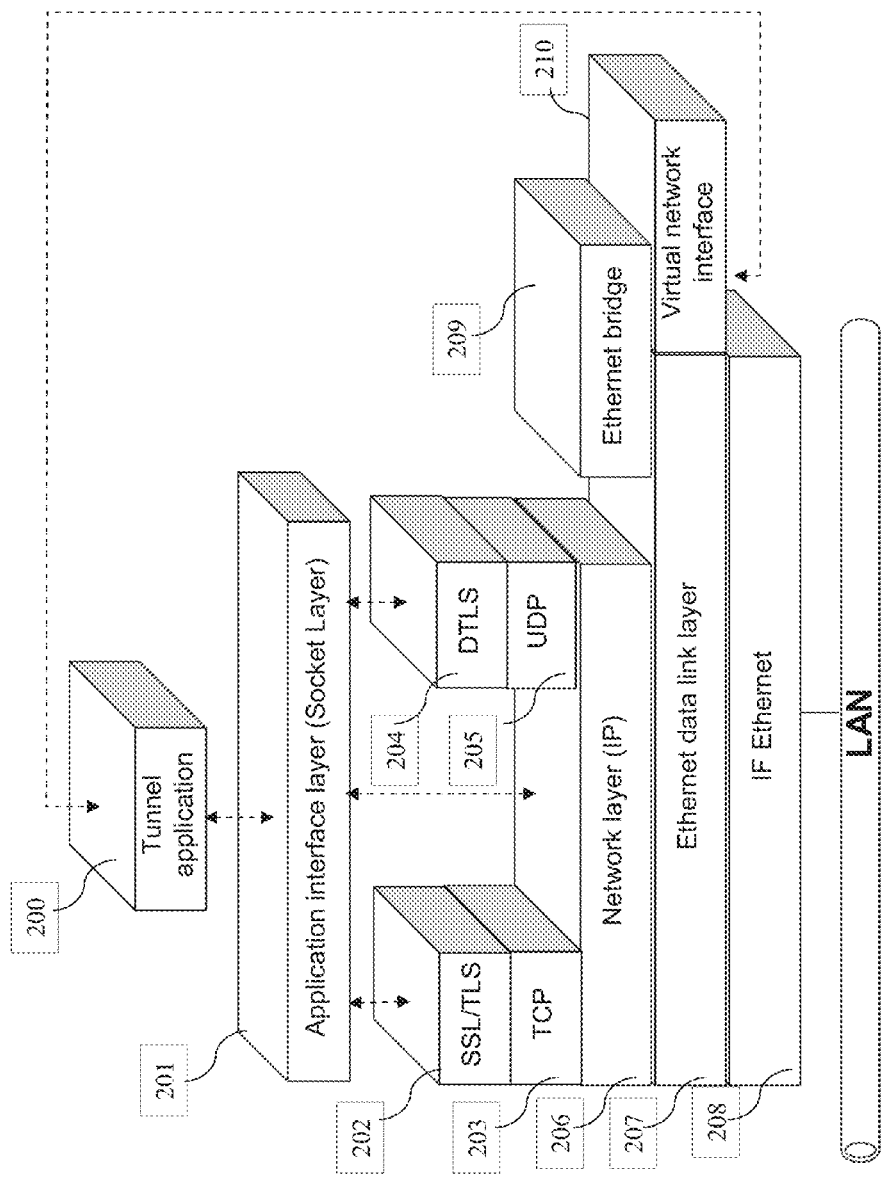
FIG. 2 illustrates schematically a protocol-layer model of a tunnel end point in which the method according to one embodiment of the invention can be applied.

FIG. 2 illustrates schematically a model in protocol layers of a tunnel end point in which it is possible to apply the method according to one embodiment of the invention.

The following description proposes a model in protocol layers necessary for the use of the tunnel 100 by the tunnel end point 101. A similar description applies to the tunnel end point 102.

In the model shown in FIG. 2 the protocol elements necessary for the functions other than using the tunnel, such as for example the protocol elements associated with the UPnP (for "Universal Plug and Play") standard, are not shown.

The transmission of an Ethernet frame originating from one of the items of equipment 108, 109, 110 (connected to LAN A 103) via the tunnel 100 to LAN B 104 takes place as follows.

The tunnel end point 101 comprises an Ethernet physical interface 208 which receives the Ethernet frames originating from the items of equipment 108, 109, 110, forwards them to a link layer 207. The Ethernet frames to be sent to the item of equipment comprising the tunnel end point are passed to a network layer 206. Other Ethernet frames are passed to a bridge layer 209. The bridge layer 209 carries out the conventional operations of an Ethernet bridge such as the filtering of the Ethernet frames and the relaying of these frames to the appropriate Ethernet output port(s). Attached to the bridge are an Ethernet interface 207 and at least one virtual interface 210 emulating an Ethernet controller. A virtual interface 210 is created for each tunnel instantiated by the application 200. The Ethernet frames that shall be broadcast throughout the whole virtual private network are passed to each virtual interface 210. In a general manner, the encapsulation protocol of the tunnel represented by the application 200 carries out the operations necessary to use each tunnel, amongst which there will notably be the configuration, the filtering and the encapsulation (forming a tunnel packet) and the extraction of a frame. In a preferred embodiment the application 200 also comprises the mechanisms specific to the invention, as are more amply described below, in particular with respect to FIG. 4.

The frames received from the virtual interface 210, after processing by the application 200, are passed in the form of packets through an application interface ("socket") 201 to a reliable transport protocol TCP 203 or an unreliable transport protocol UDP 205, respectively protected by the SSL protocol 202 and the DTLS protocol 204. After processing by a transport protocol to form a tunnel packet 250 (FIG. 3), the latter is passed to the network layer 206. The IP datagram thus formed with the tunnel packet can now be transmitted to the LAN through the link layer-207 and the physical layer 208, in order then to be propagated over the Internet network via the gateway 105.

The receipt of a frame originating from the tunnel 100 will, in the tunnel end point, follow the reverse journey to that described above.

Figure 3:
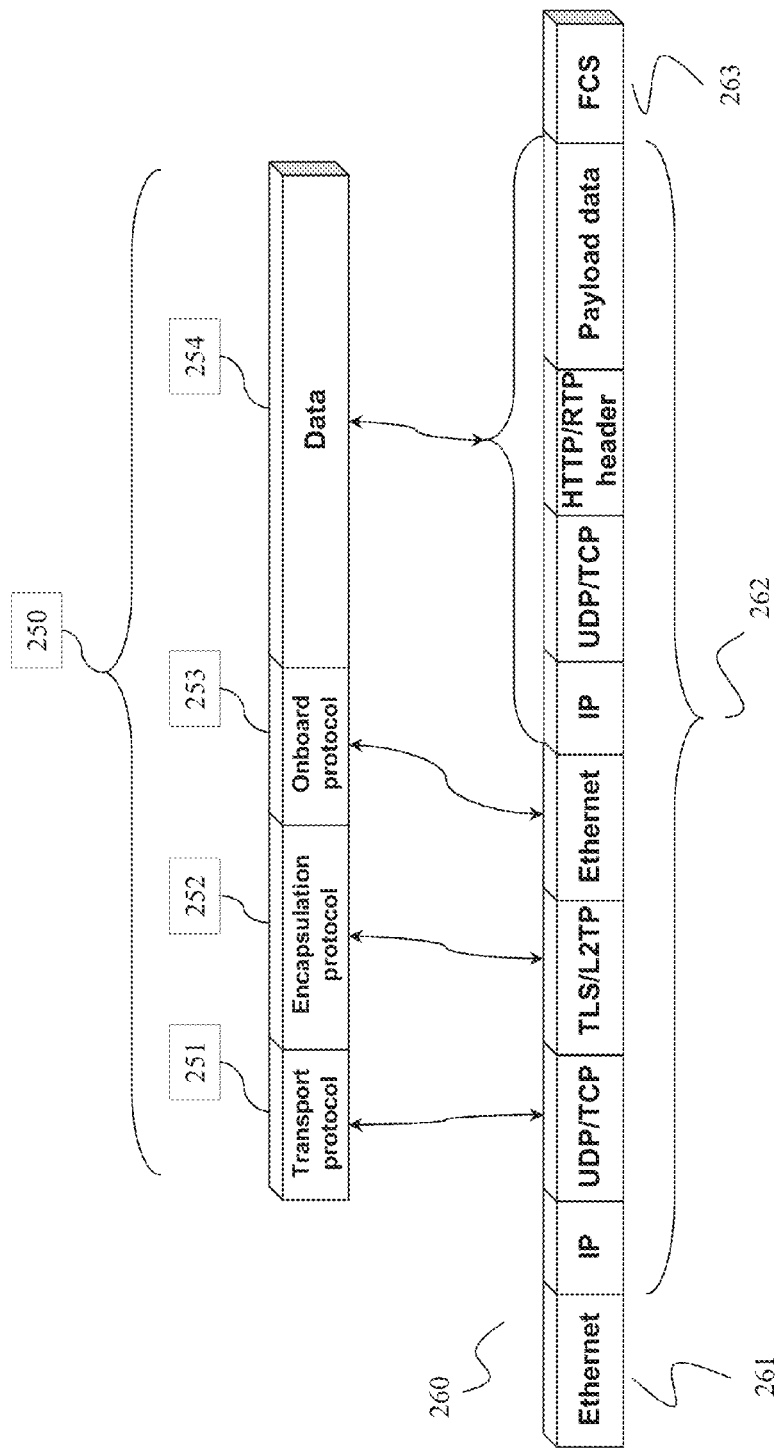
FIG. 3 illustrates schematically an Ethernet frame format in the context of using a layer-2 tunnel.

FIG. 3 illustrates schematically an Ethernet frame format in the context of the use of a layer-2 tunnel, such as the tunnel 100 of FIG. 1.

The Ethernet frame 260 transports a layer-2 tunnel packet. The Ethernet frame 260 is a frame travelling for example over LAN A 103 of FIG. 1 between the tunnel end point 101 and the gateway 105. The frame 260 carries the data originating from or going to LAN B 104.

The Ethernet frame 260 comprises:
an Ethernet header field 261,
a first IP datagram 262 itself transporting a layer-2 tunnel packet 250, and
a frame check sequence (FCS) field 263.

The tunnel packet 250, contained in the IP datagram 262, comprises:
a transport protocol header field 251 (namely TCP or UDP in the example described in detail here);
an encapsulation protocol header field 252, namely L2TP or TLS ("Transport Layer Security") in the example described here; such encapsulation protocols are notably described in the RFC-3931 standard ("Layer two tunnelling protocol—version 3 (L2TPv3)"), J. Lau et al, March 2005) and the RFC-2246 standard ("The TLS Protocol Version 1.0"),
an onboard protocol header field 253 (namely Ethernet in the example here, because the Ethernet frames transmitted by the devices connected to LAN A 103 or LAN B 104 are transported via the tunnel), and
a payload data field 254 (also called user data or application data), which itself comprises a second complete IP datagram if no fragmentation has been carried out during its transit from the device that generated it.

Figure 4:
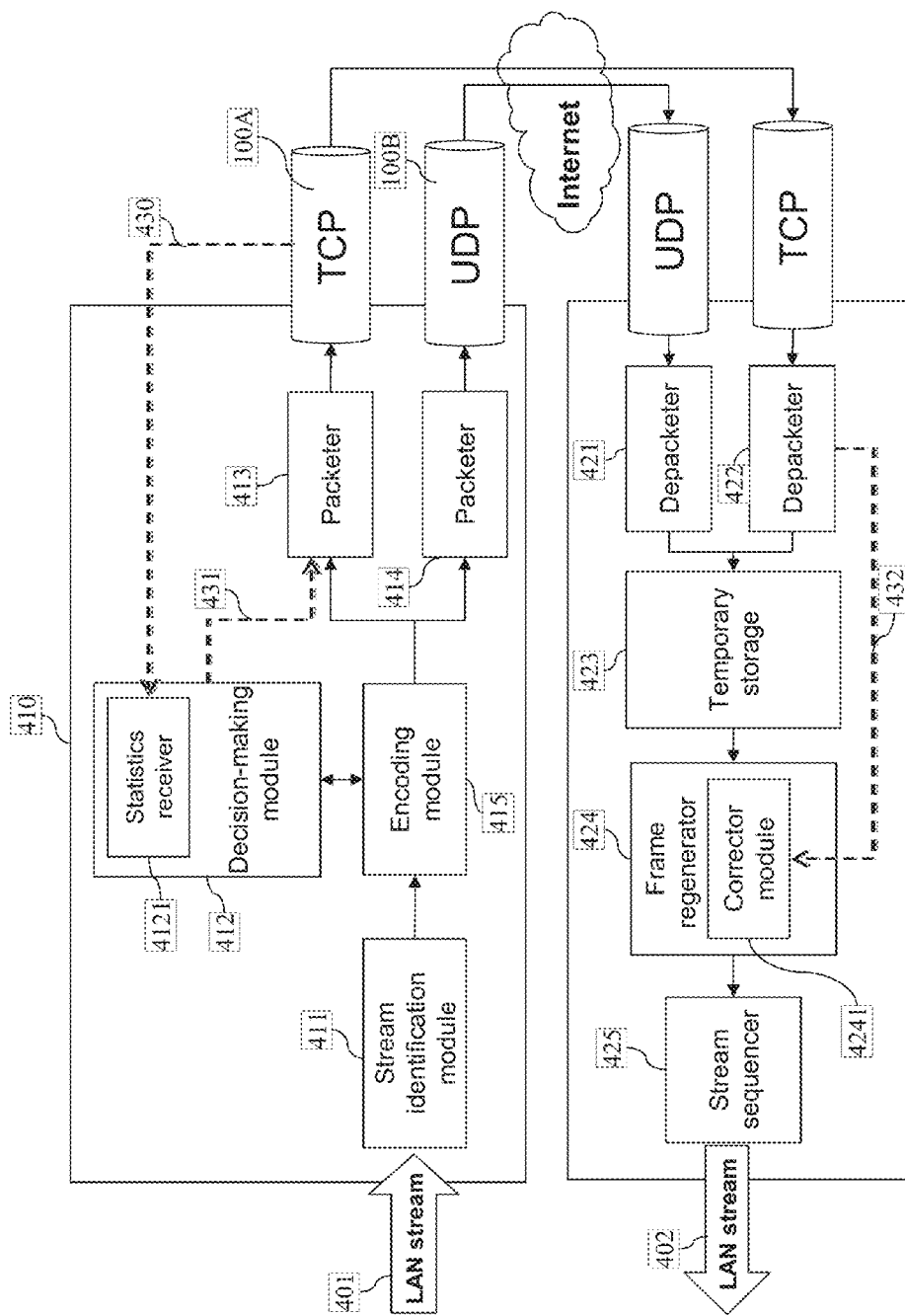
FIG. 4 illustrates schematically the functional blocks included in the tunnel end points according to one embodiment of the invention.

FIG. 4 illustrates schematically the functional blocks included in a tunnel end point 101 or 102 according to one embodiment of the invention.

The various protocol layers presented with respect to FIG. 2 are shown here in a simplified manner. Similarly, the gateways 105 and 106 are omitted. In addition, the data streams transported via the tunnel 100, but to which no error-correcting code is applied in the context of the present invention, are not shown.

It should also be noted that only one stream 401 is considered for the purposes of illustration. However, several streams similar to the stream 401 may simultaneously benefit from the advantages of the present invention.

The tunnel end point 101 comprises a transmitting block 410 and the tunnel end point 102 comprises a receiving block 420, respectively allowing the transmission and the reception of data via the tunnel 100.

The following description relates to a data stream transmission via the tunnel 100 from the tunnel end point 101 to the tunnel end point 102. A similar description applies for a transmission of a stream from the tunnel end point 102 to the tunnel end point 101.

The transmitting block 410 receives as an input a stream 401 originating from the LAN network 103 and is responsible for transporting the data of this stream via the tunnel 100, using two carriers 100A (TCP carrier) and 100B (UDP carrier).

The receiving block 420 receives the data from the tunnel 100 and reconstitutes a stream 402 of data corresponding to the original stream 401.

In one embodiment of the invention, the stream 401 is formatted according to the "RTP over UDP" transport protocol because it is a solution of the prior art particularly adapted to real-time transport ("streaming"). In another embodiment, the stream 401 may be a data set that is generated by an application layer of the tunnel end point 101 and that must be transmitted to an application layer of the tunnel end point 102. In general, the stream 401 may be formatted according to any suitable transport protocol other than RTP over UDP (such as HTTP for example).

The transmitting block 410 comprises the following elements:
a stream identification module 411, responsible for detecting and selecting the real-time (RTP) streams received from LAN A 103;
a decision-making module 412, responsible for determining parameters of an error-correcting code (or parity-encoding parameters). In this embodiment, the parameters are a number M of parity packets generated for a number K of packets of the stream 401;
an encoding module 415, responsible for generating (or encoding) parity packets from the stream 401 according to the parameters of the error-correcting code determined by the decision-making module 412, and for routing the packets to one of the carriers of the tunnel 100; and
packeters 413 and 414, each dedicated to a carrier of the tunnel 100, responsible for encapsulating the data originating from the encoding module 415.

The stream identification module 411 may make a selection of the streams that are to be supplied to the encoding module 415, and to which the method according to the invention is applied. The unselected streams are then routed to one of the carriers, for example according to the transport protocol by which they are formatted. Examples of possible data stream routing to the carriers of a multi-transport tunnel are described in EP 2 020 799. The stream identification module 411 for example makes a selection according to the class of service of the detected streams.

The decision-making module 412 comprises a statistics receiver 4121 receiving information 430 relating to transmission conditions via the tunnel 100. The decision-making module 412 is adapted to determine the error-correcting code parameters necessary for the encoding of the parity packets by the encoding module 415. In addition, the decision-making module 412 has an interface 431 with the packeter 413 in order to be able to exchange parameters with the receiving block 420 in the context of a control session established on the TCP carrier 100A.

The encoding module 415 carries out encoding on a first set of K packets of the stream 401 (called an encoding window of size K) in order to obtain a second set of M parity packets. It should be noted that, in a preferred embodiment, the encoding module 415 acts at "packet level", that is to say that the size considered for the parity encoding and decoding corresponds to the size of the payload data carried via the tunnel carriers.

The encoding module 415 is also responsible for routing the packets of the stream 401 to the UDP carrier 100B and the parity packets to the TCP carrier 100A. This mechanism is more fully described below, notably with respect to FIGS. 5 and 8.

In a preferred embodiment, the packets of the stream 401 have an MTU (for "Maximum Transmission Unit") size allowing a direct insertion of the tunnel packets constituted in the data field 254 of FIG. 3.

Figure 6:
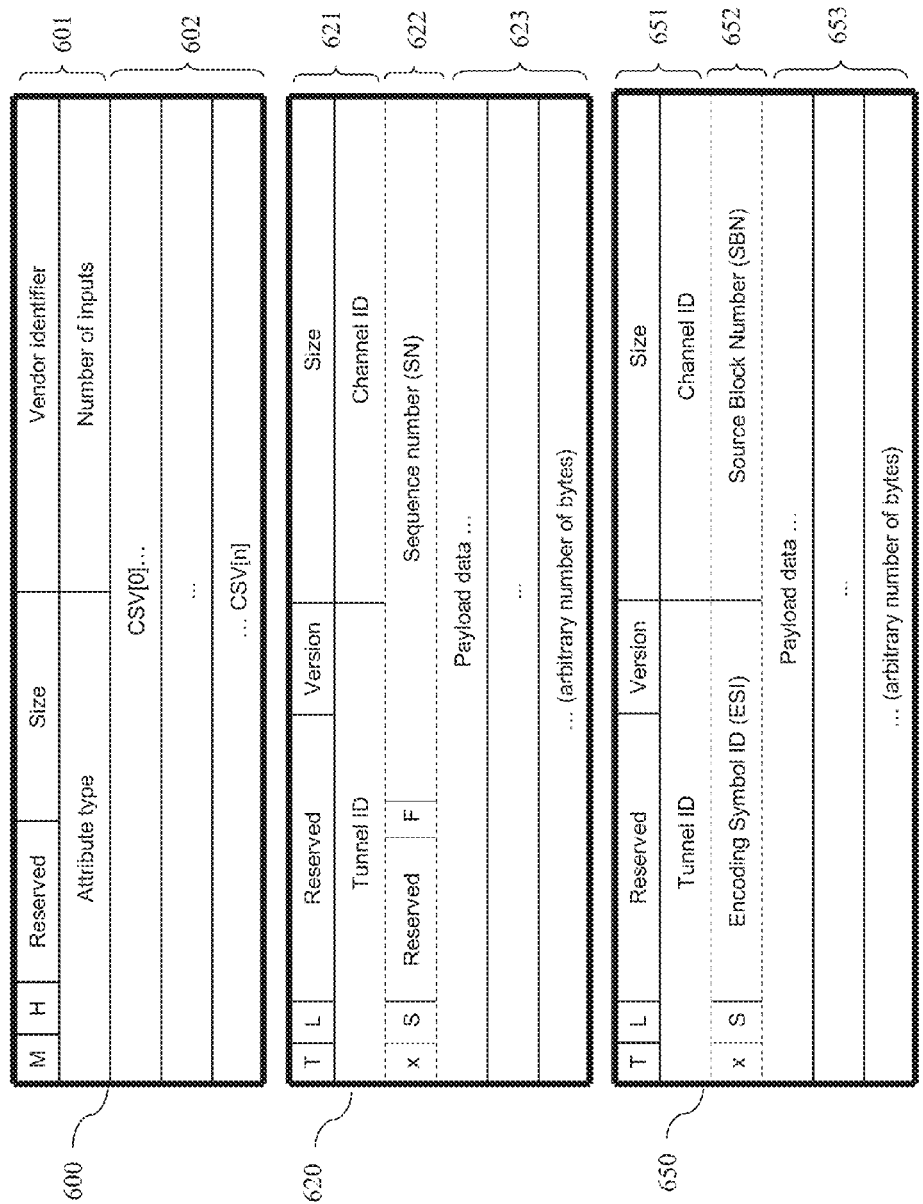
FIG. 6 illustrates schematically the data packet formats interchanged via a tunnel, according to one embodiment of the invention.

The receiving block 420 comprises the following elements:
depacketers 421 and 422, each dedicated to a carrier of the tunnel 100, responsible for decapsulating the data originating from the tunnel 100;
a temporary storage memory 423 responsible for reordering the data of the stream 401 and associating therewith the received parity data, according to a windowing marking (described in greater detail with respect to FIG. 6);

a frame regenerator 424, allowing the reconstitution of the frames of the stream 402 from the data of the stream 401 and the parity data, received from the tunnel 100 and stored in the temporary storage memory 423; and a stream sequencer 425 responsible for delivering and scheduling, on LAN B 104, the packets of the stream 402 after reconstitution; for example, for RTP streams 401 and 402, the timestamp included in the RTP packet is used in order to carry out the scheduling of the stream 402 by the stream sequencer 425, in order to maintain virtually zero jitter, that is to say a virtually constant inter-packet delay.

The frame regenerator 424 comprises a corrector module 4241, in order to reconstitute the original data packets of the stream 401 despite the data losses occurring during transmission via the tunnel, and to do so according to the windowing determined by the decision-making module 412. The frame regenerator 424 obtains the parameters 432 of the error-correcting code used by the encoding module 415 via the depacketer 422, as described later with respect to FIG. 6.

Figure 5:
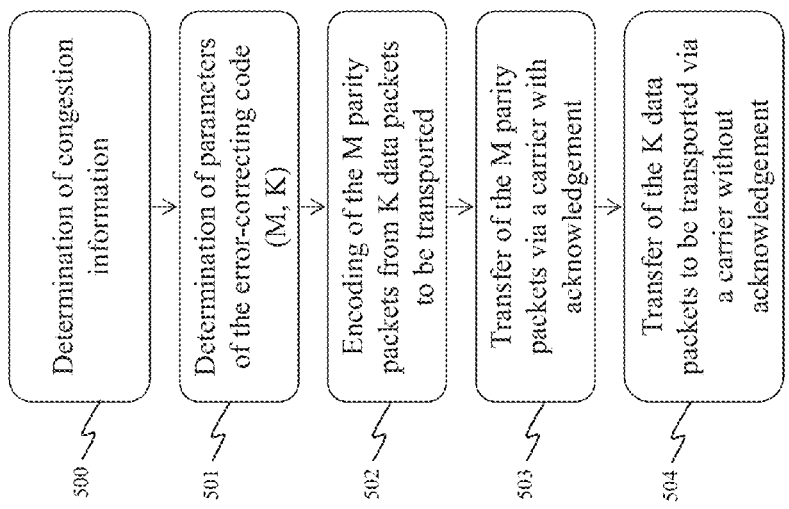
FIG. 5 shows a flow chart of the algorithm used by a tunnel end point transmitting a multimedia data stream, according to one embodiment of the invention.

FIG. 5 represents a flow diagram of an algorithm used by the transmitting block 410, according to one embodiment of the invention.

All the steps of the algorithm shown in FIG. 5 may be implemented in software by execution of a set of instructions or program by a programmable computing machine, such as a PC ("Personal Computer"), a DSP ("Digital Signal Processor") or a microcontroller; or else implemented in hardware by a machine or a dedicated component, such as an FPGA ("Field-Programmable Gate Array") or an ASIC ("Application-Specific Integrated Circuit").

In a step 500, the decision-making module 412 obtains information relating to congestion in the network connecting the tunnel end points 101 and 102.

A margin available in the TCP carrier of the tunnel may be determined by a number of methods. In other words, an FWS ("Free Window Space") instantaneous windowing is obtained indicating the difference between a reference value of the TCP congestion window (called "cwnd" according to the TCP protocol) and a congestion window value actually used for the data transmission on the TCP carrier (called "send_wnd").

In a first determination method, the send_wnd value is obtained by regularly measuring the bit rate (called "passenger_flows_bitrate") of the data packets received from LAN A 103 and transmitted over the TCP carrier of the tunnel, and by using the RTT ("Round Trip Time" according to the TCP protocol) value. The send_wnd value may then be obtained according to the following formula:

send_wnd=passenger_flows_bitrate*RTT/2

The memory capacity of the equipment, such as the devices 108 to 113, is designed so as to support transmission of a stream over a LAN, that is to say a transmission with little latency (a few milliseconds). For example, for a bit rate of the order of 100 Mbps and an RTT value of 5 milliseconds, the congestion window of the TCP servers will be limited to 65 kilobytes.

By virtue of the tunnel 100, the streams are transported over the Internet network in total transparency for the devices 108 to 113. The memory capacity of the tunnel end points is designed so as to support transmission of a stream over the Internet network, that is to say transmission with a much lower bit rate (for example 10 Mbps) and a higher latency (for example more than 100 milliseconds). Therefore, the bit rate*delay product, which indicates the memory value necessary (according to the example, 125 kilobytes), is much greater on a tunnel end point. It is therefore possible to have free "space", that is to say a margin in the congestion window, for a data transmission via the TCP carrier of the tunnel 100.

This then gives an instantaneous windowing FWS in the following manner:

FWS=cwnd−send_wnd (in number of bytes)

or

FWS=(cwnd−send_wnd)/MSS (in number of packets)

where MSS represents the "Maximum Segment Size" parameter of the TCP protocol.

In a second determination method, the instantaneous windowing FWS is determined from a parameter internal to the TCP protocol stack indicating the number of data that can be transmitted (commonly called the "usable window" according to the TCP protocol windowing management protocol). The instantaneous windowing value FWS is then obtained based on the following formula:

FWS="usable window"−TCP_Tx_buffer (in number of bytes), that is to say:

FWS=(min(cwnd,rwnd)−(snd_nxt−snd_una))−TCP_Tx_buffer where TCP_Tx_buffer represents the number of data in the transmission memory zone, that is to say awaiting transmission over the TCP carrier (in number of bytes), cwnd and rwnd represent respectively the TCP congestion window (on the transmitting block 410) and the receiving window offered by the receiving block 420 ("advertised window" of the TCP protocol), snd_una represents the sequence number of the oldest datum not yet acknowledged according to the TCP protocol (in number of bytes), and snd_nxt represents the sequence number of the next datum to be transmitted.

With either of the aforementioned methods for determining the available margin, a positive FWS value indicates free "space" allowing the transmission of the parity packets via the TCP carrier of the tunnel 100 without congesting the TCP carrier.

Then, during a step 501, applied by the decision-making module 412, parameters of the error-correcting code to be applied to the stream 401 are determined according to the congestion information (that is to say relating to the transmission conditions via the tunnel 100) obtained. This step is designed notably to determine the parameters K (number of packets selected from the stream 401 to which the error-correcting code is applied) and M (number of parity packets, resulting from the application of the error-correcting code on the packets selected from the stream 401). In this embodiment the number M is directly associated with the instantaneous windowing value FWS. This will be more amply addressed below with respect to FIG. 9.

In a step 502, the encoding module 415 generates the M parity packets from the K packets of the stream 401. It is also said that it encodes the M parity packets from the K packets of the stream 401 (the M packets being thus encoded data, with this terminology). This then gives a total number N of packets, such that N=M+K, to be transmitted via the tunnel. The encoding module 415 routes, in a step 503, the M parity packets to the TCP carrier via the packeter 413 and, in a step 504, the K packets originating from the stream 401 to the UDP carrier via the packeter 414. Therefore the transmission of the stream packets via the UDP carrier of the tunnel is made reliable by the transmission of parity packets via the TCP carrier of the tunnel, while preventing congestion of the TCP carrier.

FIG. 6 illustrates schematically the formats of data packets exchanged between the tunnel end point 101 and the tunnel end point 102 via the tunnel 100, according to one embodiment of the invention.

As an illustrative example, a tunnel encapsulation according to the L2TP protocol, described in particular in the RFC-3931 standard already mentioned, is used.

A structure 600 represents a format of packets as exchanged between the tunnel end point 101 and the tunnel end point 102 in the context of a tunnel control session. As an illustration, it is considered that the multi-transport tunnel control session is established on the TCP carrier 100A.

Specifically, in order to be able to apply an FEC ("Forward Error Correction") error-correcting mechanism, the encoding module 415 must inform the correcting module 4241 of the parameters of the error-correcting code (particularly the parameters M and K) that are used. As described below, the parameter K is preferably transmitted via a message of structure 600. As a variant, it may be transmitted via messages of structure 620 (detailed hereinafter). The parameter M is determined by the receiver 420 by virtue of an ESI (for "Encoding Symbol ID") symbol of a structure 650 (detailed hereinafter).

The structure 600 is an AVP ("Attribute Value Pair") structure according to the L2TP protocol and is used to communicate the parameters of the error-correcting code used by the encoding module 415. The depacketer 422 analyses the packets received from the TCP carrier to recover the parameters, then supplies the recovered parameters to the frame regenerator 424.

The header 601 includes an attribute code ("Attribute Type") so that the receiving block 420 recognizes the type of the structure communicated.

A "payload data" field 602 provides information controlling the operations of the error-correcting mechanism which must be shared between the encoding module 415 and the correcting module 4241. In a preferred embodiment, this information relates to the FEC OTI ("Forward Error Correction Object Transmission Information"), object as specified in the RFC-5052 standard ("FEC Building Block").

The RFC-5052 standard specifies that an FEC OTI object contains an identifier, called the "FEC Encoding ID", of the type of error-correcting code used. Such information allows the frame regenerator 424 to choose the appropriate error-correcting algorithm. Certain of these identifiers are registered with the IANA ("Internet Assigned Numbers Authority") authority for the usual error-correcting codes; for example for a Reed-Solomon error-correcting code, the value is "2".

An OTI object may also contain additional parameters, such as for example:
"FEC Instance ID": an integer indicating a particular instance associated with the aforementioned encoding type
"Encoding-Symbol-Length": an integer indicating the length (in bytes) of a packet after application of the error-correcting code, the encoding being (as already mentioned) applied at "packet level" (that is to say that a symbol is the equivalent of a packet);
"Maximum-Source-Block-Length": an integer indicating an encoding window size (equivalent to a maximum value of the parameter K already mentioned);
"Max-Number-of-Encoding-Symbols": an integer indicating a maximum total number of packets to be transmitted for a given encoding window (equivalent to a maximum value of the parameter N already mentioned).

It should be noted that the structure 600 supports any proprietary extension and may for example allow the transmission of the coefficients of an encoding matrix.

In one preferred embodiment, these elements are transmitted in the form of values separated by commas according to the open text computer format called CSV (for "Comma-Separated Values"), as for example described in the RFC-4180 standard as the "text/csv" MIME ("Multipurpose Internet Mail Extensions") type.

This format may be replaced by any format suitable for describing lists of elements, such as for example a format similar to XML ("eXtensible Markup Language").

The structure 620 shows a packet format of the UDP carrier 100B of the tunnel 100, encapsulating the packets of the stream 401. This format follows the recommendations of the L2TP protocol.

A field 622 represents, according to the L2TP protocol, a transport-specific sub-layer allowing the insertion of a sequence number SN useful for operations carried out on receipt of the packets, such as for example the reordering of the data. This sequence number SN makes it possible, in the context of the preferred embodiment, to group the packets of the stream 401 of one and the same encoding window (of size K). In addition, a field F ("Flag") allows the receiver of the packet to determine whether the content 623 has been the subject of parity encoding by the encoding module 415.

The structure 650 represents a packet format of the TCP carrier 100A of the tunnel 100, encapsulating the parity packets formed by the encoding module 415 from the packets of the stream 401.

A field 652 represents a transport-specific sub-layer of the parity packets, allowing the insertion:
of a windowing marking (called SBN for "Source Block Number"), useful for identifying the encoding window of K packets with which the encapsulated packet is associated;
of an encoding symbol identifier ESI, providing additional information identifying the packets of the stream 401 used for encoding the parity data.

Therefore, the information in the field 652 identifies the encoding window of K packets of the stream 401 concerned and the relationship (via ESI) between the parity data carried in the zone 653 and the K packets of the stream 401 concerned.

In the following example, the encoding module 415 constructs M=3 parity packets from K=10 packets of the stream 401. The first packet of the stream 401 in question has a sequence number SN=500 for transport on the UDP carrier 100B. In this case, the packets of structure 650 carrying the parity packets on the TCP carrier 100A are constructed with the following parameters: for a current encoding window (i):

| (K = 10, M = 3) | 1$^{st}$ packet | 2nd packet | 3rd packet | | 10th packet |
|---|---|---|---|---|---|
| UDP (620): | SN = 500 | SN = 501 | SN = 502 | . . . | SN = 509 |
| TCP (650): | SBN = 500 ESI = 1 | SBN = 500 ESI = 2 | SBN = 500 ESI = 3 | x | x | for the next encoding window (i+1):

| (K = 10, M = 3) | 1st packet | 2nd packet | 3rd packet | ... | 10th packet |
|---|---|---|---|---|---|
| UDP (620): | SN = 510 | SN = 511 | SN = 512 | ... | SN = 519 |
| TCP (650): | SBN = 510 ESI = 1 | SBN = 510 ESI = 2 | SBN = 510 ESI = 3 | x | x |

In the above example, the ESI field corresponds to the index number of the parity packet generated. This applies in particular to the case of usage of a Reed-Solomon correcting code. The ESI field thus used allows the decoder to determine the parameters of the error-correcting code associated with each packet, for example by indicating from which line of the encoding matrix the parity packet originates.

The packets of structure 650 carrying the parity packets have a sequence number (or windowing marking) that is identical for one and the same encoding window, and the recycling of the value of the SBN field (incremented by one unit for each new encoding window of K packets of the stream 401) must be sufficiently spaced so that no windowing marking is reused before all the data of a previous encoding window with the same windowing marking has been processed by the frame regenerator 424.

In the context of a use of an error-correcting code of Reed-Solomon type applied at packet level, the encoding can be performed thanks to a matrix. The K packets of the encoding window are placed so that each one forms a column of the matrix, each element of the matrix thus representing a symbol. An error-correcting code of Reed-Solomon type C(N,K) is then applied on each row of the matrix to generate at least one parity symbol (according to the code C(N,K) applied). A matrix (or a vector, according to the code C(N,K) applied) of parity symbols is then obtained, each column forming a parity packet. In a reciprocal way, the operation of decoding is performed by placing the received packets such that each packet forms a column of the matrix, each element of the matrix thus representing a received symbol. A Reed-Solomon decoding corresponding to the code C(N,K) is then applied on the lines of this matrix, in order to obtain a resulting matrix comprising the original symbols. The K packets of the encoding window thus form the columns of this resulting matrix.

The following description gives details of an error-correcting code based on use of EXCLUSIVE-ORs (XORs), that is to say an operation EXCLUSIVE-OR (XOR) is applied between the K packets of the stream 401. In this case, the ESI field has a use that is different from that of the above example. The ESI field then indicates the scope of the EXCLUSIVE-OR (XOR) operation on an encoding window of K packets of the stream 401. For example, if a parity packet is created from the first 5 packets (of the stream 401) of an encoding window of 10 packets (K=10), the binary value of the ESI field is:
ESI='1111100000000',
each bit being associated with a packet of the encoding window, and the value of this bit indicates whether the associated packet (from the K packets) has been used by the error-correcting code (bit set to 1 if this is the case, bit set to 0 otherwise).

In the context of a use of EXCLUSIVE-ORs (XORs) to generate a parity packet, the K source packets are combined as follows:
let "$p_1, p_2, \ldots, p_K$" be the K packets (of size "m") of the stream 401 and "$p_j^i$" be the value of the $i^{th}$ bit of the packet "$p_j$" (j=1, ..., k);

let "r" be the parity packet to be generated and "$r^i$" be the value of the $i^{th}$ bit of the parity packet;
then:

$$r^i = \sum_{j=1}^{K} p_j^i (\text{mod} 2) \forall\ i \in \{1, \ldots, m\}$$

Thus, it is sufficient to perform the bit-by-bit sum over the K packets received to recover the lost packet from the K+1. This operation, which is very easy to implement on embedded hardware, requires one processing cycle (or CPU (Central Processing Unit) cycle) for each code word transmitted, which induces a very low processing time.

The size of the ESI field is then at least K bits, so as to be able to associate one bit per packet of one and the same encoding window. This usage of the ESI field will be more particularly detailed with reference to the step 805 of FIG. 8.

The selection of a subset of packets from the packets of the encoding window is expressed below by the parameter K'. Such a selection of a subset of packets is particularly advantageous when the stream 401 is a multiplexed RTP stream, the multiplexing of the data making it easier to select this subset from the K packets of the encoding window.

According to a first example, the stream 401 transports JPEG 2000 multimedia data, as defined by the RFC-5371 standard. Each RTP packet then carries a sub-portion of these multimedia data, each sub-portion having its own importance (or priority). A selection of K' packets may then be made from the most important data within an overall encoding window of K packets.

According to a second example, the stream 401 consists of independent sub-streams as for example defined by the RFC-4598 standard for the transport of E-AC-3 (for "Enhanced AC-3") audio data or the RFC-3640 standard for the transport of MPEG-4 individual streams. A selection of K' packets may then be made on an overall encoding window of K packets so as to apply the parity encoding to the data of one or more given sub-streams.

Figure 7:
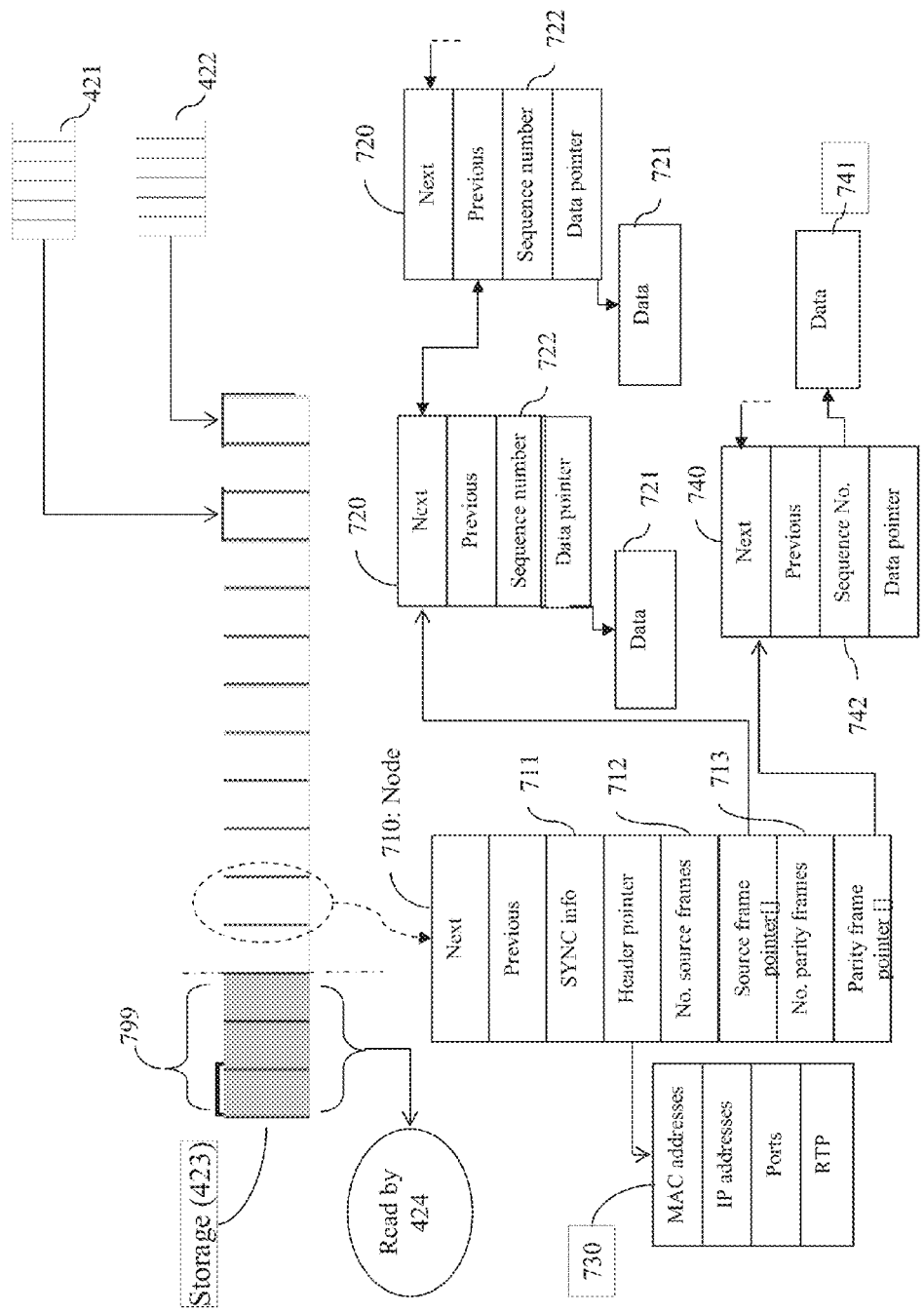
FIG. 7 illustrates schematically the storage, by a tunnel end point, of the data received from the various carriers of a multi-transport tunnel, according to one embodiment of the invention.

FIG. 7 illustrates schematically the storage, by the tunnel end point 102, of the data received from the various carriers of the tunnel 100, according to one embodiment of the invention.

The temporary storage memory 423 makes it possible temporarily to store the packets received via the UDP carrier 1008, in order to allow time for the associated parity packets to be received via the TCP carrier 100A. Specifically, the TCP carrier has a greater latency than the UDP carrier. For example, the temporary storage memory 423 is designed to preserve the RTP packets of the stream 401 for a period that is longer by half the RTT value than a conventional tunnel end point temporary storage. Such an increase in the memory capacity in reception is amply sufficient to absorb the difference of latency between the UDP and TCP carriers. The latency induced by this additional temporary storage is minimal compared with the overall latency of the Internet network.

The temporary storage memory 423 is represented here in the form of a linked list of elements 710, called nodes. Each node 710 corresponds to a set of data packets 623 or of parity packets 653 relating to the stream 401, stamped by one and the same windowing marking number SYNC 711 (corresponding to the SBN field as described with respect to FIG. 6).

A node 710 comprises:

pointers to the next and previous nodes 710 in order to form the linked list;

a windowing marking number SYNC 711 suitable for the identification of an encoding window of K packets and making it possible to order the nodes 710 with respect to one another;

a pointer to a common structure 730, associated with the set of packets of the stream 401 and of the resulting parity packets, grouping the unvarying data related to the stream 401, such as for example those associated with the RTP protocol;

a number 712 of packets of the stream 401 received by the depacketer 422 for the encoding window identified by the SYNC number 711;

a table of packets of the stream 401 pointing to a linked and ordered list of descriptors 720 of packets originating from the stream 401; a number 713 of parity packets received by the depacketer 421 for the encoding window identified by the SYNC number 711;

a table of parity packets pointing to a linked and ordered list of descriptors 740 of parity packets.

The common structure 730 comprises the following information:

the MAC addresses of the client and server devices between which the stream 401 (and the regenerated stream 402) is transmitted;

the IP addresses of these client and server devices;

the ports used for the RTP connection of these client and server devices;

the RTP header information:
the current version of the RTP protocol ("Ver": Version);
the format of the data transported ("PT": Payload Type);
the identifier of the synchronization source SSRC ("Synchronization Source") and the identifier of the contributing source CSRC ("Contributing Source"), according to the RTP protocol.

The packet descriptor 720 of the stream 401 comprises:

pointers to the next and previous descriptors 720 in order to form a linked list;

a sequence number 722, storing the sequence value SN of the field 622 of the packet of the stream 401 described by the descriptor 720;

a pointer to a memory zone 721 storing the packet of the stream 401 described by the descriptor 720.

The parity packet descriptor 740 comprises:

pointers to the next and previous descriptors 740 in order to form a linked list;

a sequence number 742, storing the ESI information of the field 652 of the parity packet described by the descriptor 740;

a pointer to a memory zone 741 storing the parity packet described by the descriptor 740.

Therefore, on receipt of data originating from the TCP carrier 100A and/or the UDP carrier 1008 of the tunnel, the depacketers 421 and 422 are capable of inserting each received datum 623 or 653 (see FIG. 6) in the correct place in the linked lists described above, and of filling the fields of the nodes 710, descriptors 720 and 740, and common structures 730.

The depacketer 421, on receipt of a packet via the UDP carrier 1008, searches for the node 710 with which to associate the received packet 620, according to the SN information which the latter carries in its field 622. If the value of the sum {SN+K} is greater than the value of the SYNC field 711 of the last node 710 of the linked list, then a new node 710 is created, and the value of the sum {SN+K} is assigned to its SYNC field 711. In the contrary case, the last node 710 of the linked list is selected.

For the selected node, a packet descriptor 720 of the stream 401 is created, the SN information is assigned to the field 722 and the data 623 of the received packet are stored in the associated memory zone 721. The descriptor 720 is then inserted in the table of packets of the stream 401 of the node 710: the frame number (or packet number) 712 is incremented and the descriptor 720 is inserted in the linked list in an ordered manner according to the value of the sequence number stored in the field 722.

In one preferred embodiment, the presence of a positive label positioned in the field F of the packet received via the UDP carrier 100B indicates that this packet is not part of an encoding window to which an error-correcting code has been applied; this packet is therefore an isolated element and is therefore inserted into a new node 710 (which is then limited to this one packet).

The depacketer 422, on receipt of a packet via the TCP carrier 100A, searches for the node 710 with which to associate the received packet 650, according to the SBN information that the latter carries in its field 652. In the case (very rare) in which the SBN value is greater than the value of the SYNC field 711 of the last node 710 of the list, a new node 710 is created and the SBN value is assigned to the SYNC field 711. Such a case corresponds to the total loss of the packets of the stream 401 which have been transmitted via the UDP carrier and which have been used by the encoding module 415 to create the parity data received. Otherwise, the node 710 identified by virtue of the SBN information is selected.

For the selected node, a parity packet descriptor 740 is created, the ESI information is assigned to the field 742, and the data 653 of the received packet are stored in the associated memory zone 741. The descriptor 740 is then inserted into the parity packet table of the node 710: the number of frames (or packets) 713 is incremented and the descriptor 740 is inserted into the linked list. This insertion takes place in an ordered manner according to the value of the sequence number stored in the field 742, when the ESI field represents a generated parity packet index number. The ordering of the list following the insertion of the descriptor 740 has no importance in the case when the ESI field represents the scope of the EXCLUSIVE-OR (XOR) operation on the encoding window of K packets.

Therefore, by virtue of the descriptors 720 and 740, the frame regenerator 424 is capable of obtaining the data necessary for the reconstruction of a set of K data packets for each node 710, thereby allowing the generation of the stream 402.

According to the losses sustained on the UDP carrier 100B of the tunnel 100 and the number of parity packets received in time for a given encoding window, the stream 402 may be only a subset of the stream 401, the objective being to make the stream 402 as faithful as possible to the stream 401. If no parity packet has been received (a zero value in the field 713) for a given encoding window, the received packets of the stream 401 are directly used by the stream sequencer 425 without being decoded (no error correction) by the correcting module 4241. For example, according to the illustration of FIG. 7, three nodes 799 are available for extraction and transmission to LAN B 104. From the descriptors 720 and 740, the frame regenerator 424 decides to supply these elements to the correcting module 4241. Then, the correcting module 4241 supplies a set of K packets, each packet being either a packet 623 as received via the UDP carrier, or a packet reconstituted from the parity packets 653.

Once a node 710 has been used by the frame regenerator 424, this node is deleted from the temporary storage memory 423, and the next node is selected for further processing.

Figure 8:
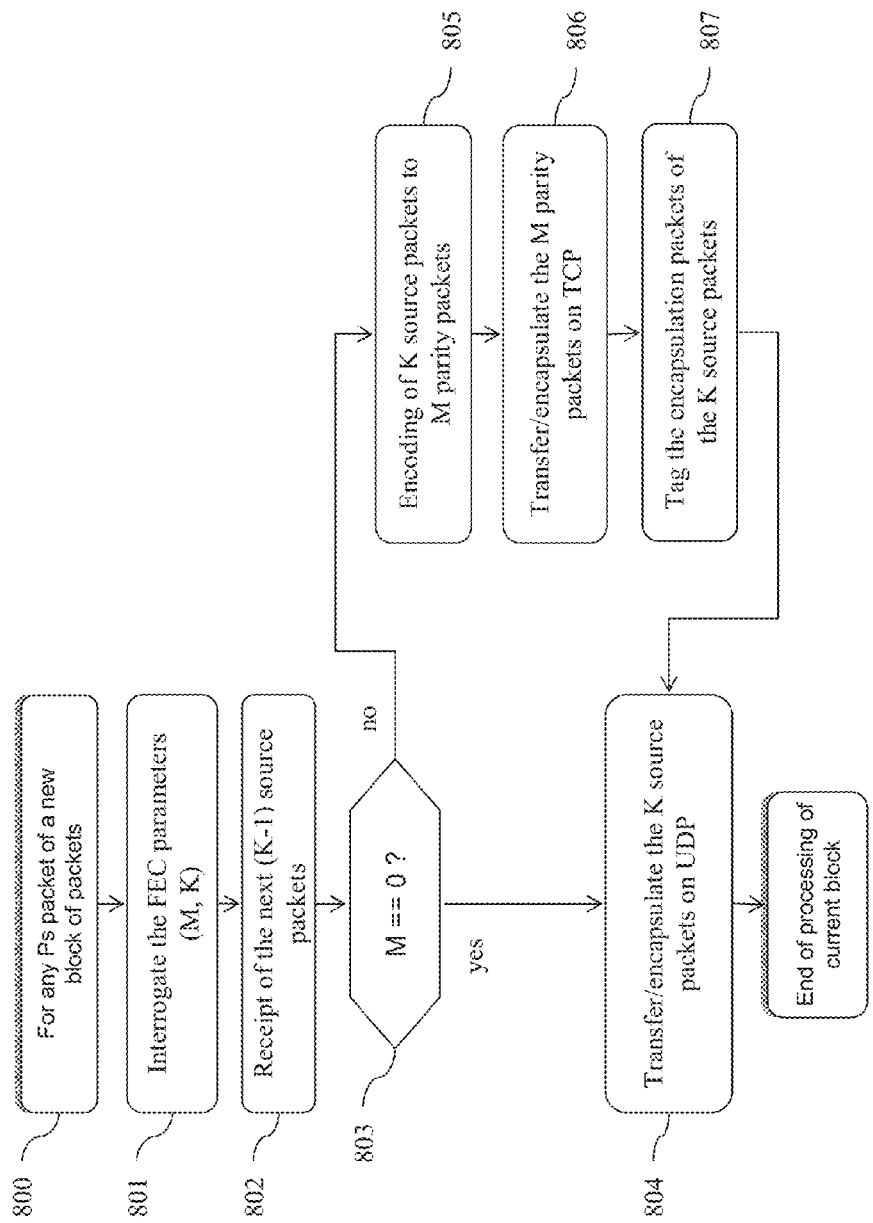
FIG. 8 shows a flow chart of an algorithm used by an encoding module of a tunnel end point transmitting a multimedia data stream, according to one embodiment of the invention.

FIG. 8 represents a flow chart of an algorithm used by the encoding module 415 of the tunnel end point 410 transmitting the multimedia data stream 401 according to one embodiment of the invention.

All the steps of the algorithm represented in FIG. 8 may be implemented in software by execution of a program by a programmable computing machine, such as a PC ("Personal Computer"), a DSP ("Digital Signal Processor") or a microcontroller; or else implemented in hardware by a machine or a dedicated component, such as an FPGA ("Field-Programmable Gate Array") or an ASIC ("Application-Specific Integrated Circuit").

In a step 800, the encoding module 415 receives one or more packets of the stream 401, originating from the stream identification module 411. In a step 801, the encoding module 415 interrogates the decision-making module 412 in order to obtain the parameters M (number of parity packets) and K (number of packets of the stream 401 in order to generate the M parity packets) of the error-correcting code to be applied.

Figure 9:
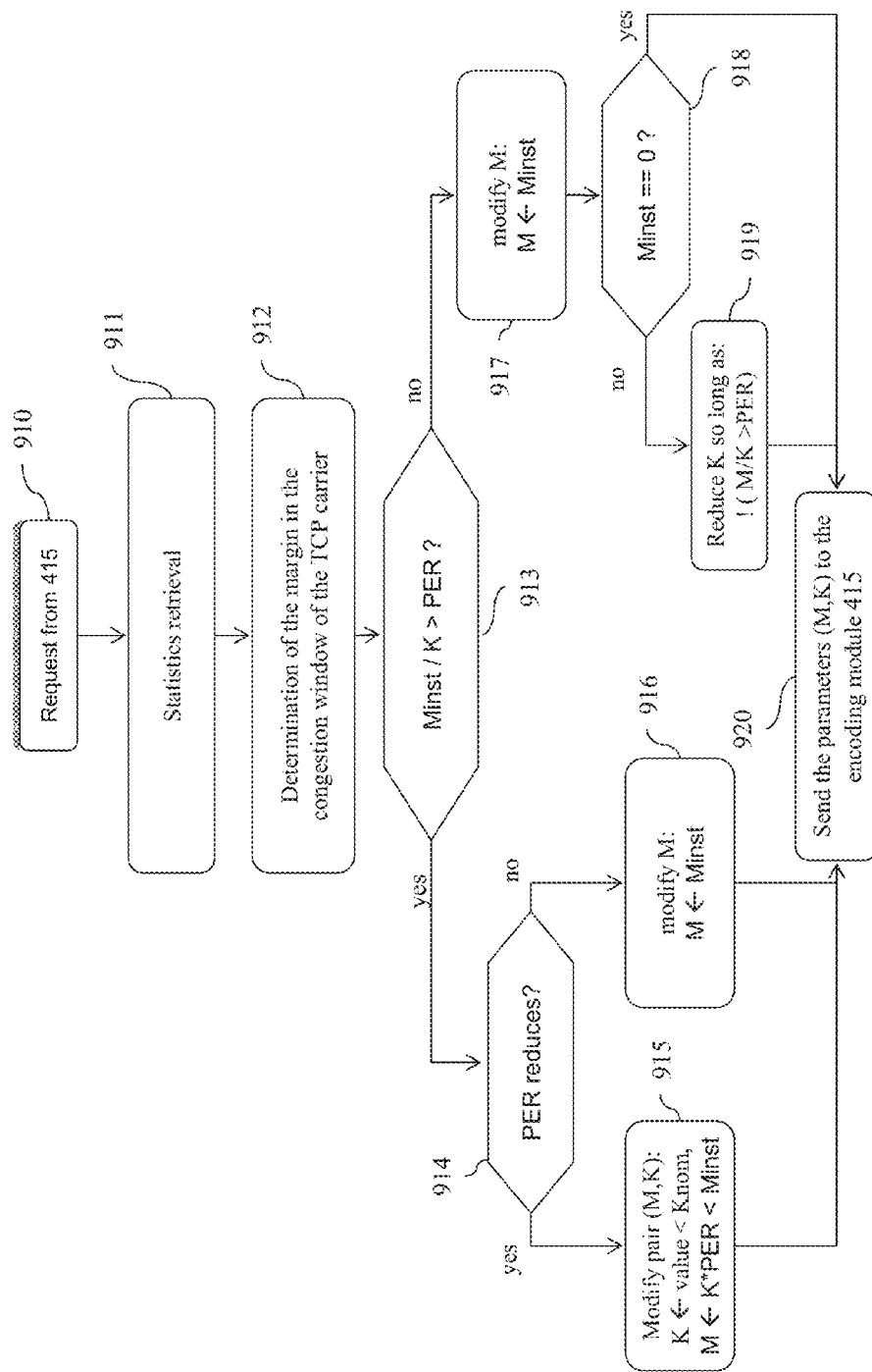
FIG. 9 shows a flow chart of an algorithm used by a decision-making module of a tunnel end point transmitting a multimedia data stream, according to one embodiment of the invention.

According to a preferred embodiment, described in detail with respect to FIG. 9, the encoding module 415 also receives if necessary a parameter K'.

The parameter K representative of an encoding window size is preferably transported via a message of structure 600 in a control session of the tunnel 100, as described previously.

According to a preferred embodiment, the step 801 is used periodically. Therefore, a set of H consecutive encoding windows of K packets of the stream 401 uses the same error-correcting code parameters. A message is therefore sent in a session for controlling the tunnel 100 by the transmitting block 410 to the receiving block 420 on each modification of the encoding window size K or for each set of H consecutive encoding windows.

In the case of frequent variations of the encoding window size K, it is more appropriate to transport the parameter K via a message of structure 620.

In a step 802, the encoding module 415 waits until the stream identification 411 has supplied the missing packets of the stream 401 in order to form a complete encoding window of K packets.

In a step 803, the encoding module 415 verifies whether the parameters supplied by the decision-making module 412 indicate that no parity packet is necessary or that no packet can be transmitted. In the event of a positive verification (M=0), a step 804 is executed and the set of K packets of the stream 401 is supplied to the packeter 414 for a further transmission to the UDP carrier 1008. In the case of negative verification (M>0), in a step 805, the encoding module 415 proceeds to generate the M parity packets from the K packets of the stream 401.

As already mentioned with respect to FIG. 6, according to the chosen error-correcting code, an ESI value is associated with each constructed parity packet.

According to a preferred embodiment described in detail with respect to FIG. 9, an additional parameter K' is supplied by the decision-making module 412; if this parameter K' is not zero, then the error-correcting code is applied to K' packets of the stream 401 instead of K. This means that the encoding window remains at K packets, but that only K' packets are used to encode the M parity packets. The ESI value, representing the scope of the EXCLUSIVE-OR (XOR) operation, therefore indicates the K' packets of the stream 401 to which the error-correcting code is applied.

These M parity packets, and the associated ESI values, are sent (step 806) to the packeter 413 for transmission on the TCP carrier 100A.

The K packets of the stream 401 are updated with a label indicating that these packets have been subjected to a parity encoding. In a step 807, the packets are then supplied to the packeter 414 in order to be transmitted via the UDP carrier 100B. In a preferred embodiment, this label is indicated in the field F of each packet of structure 620 encapsulating the K packets of the stream 401.

In one preferred embodiment, the packeter 414 informs the packeter 413 of the sequence number (SN) used in the field 622 of the UDP packet encapsulating the first of the K packets of the encoding window. Therefore, the parity packets, associated with this encoding window, are transmitted on the TCP carrier 100A with an SBN field equal to the SN value supplied by the packeter 414. Then, the packeter 413 updates the ESI field for each encapsulated parity packet.

FIG. 9 represents a flow chart of an algorithm used by the decision-making module 412 of the tunnel end point 101 transmitting the multimedia data stream 401, according to one embodiment of the invention.

All the algorithm steps shown in FIG. 9 may be implemented in software by executing program by a programmable computing machine, such as a PC ("Personal Computer"), a DSP ("Digital Signal Processor") or a microcontroller; or else implemented in hardware by a machine or a dedicated component, such as an FPGA ("Field-Programmable Gate Array") or an ASIC ("Application-Specific Integrated Circuit").

During the initialization of the tunnel end point 101, a nominal value Knom of the encoding window size K to be considered for the error-correcting code is determined. This nominal value may be defined in an arbitrary manner or may be determined according to the size of the temporary storage memory 423 (which may be predefined or received from the tunnel end point 102 during initialization):

$$\text{Max\_recv\_buffer} = \min(\text{rate\_401}*(1+\text{coef})*\text{RTT}, \text{size\_423})$$

where:
"rate_401" is the sum of the bandwidth of all of the streams transported via the tunnel 100, including the stream 401;
"coef" defines an acceptable margin for absorbing the latency difference between the UDP 100B and TCP 100A carriers (with respect to the description of FIG. 7, a value of ½ is used);
"size_423" is the size of the temporary storage memory 423.

The nominal value Knom can then be determined according to the average relative bit rate between the data transmitted on the UDP carrier 100B and the data transmitted on the TCP carrier 100A:

$$K\text{nom} = (\text{Max\_recv\_buffer}/\text{MSS})*(\text{rate\_TCP}/\text{rate\_401})$$

where: "rate_TCP" is the average bit rate of the data transmitted on the TCP carrier 100A.

A step 910 is performed in response to a request from the encoding module 415. This starts the algorithm for determining the parameters for a given encoding window of packets of the stream 401.

In a step 911, the statistics receiver 4121 retrieves the transmission statistics 430 via the tunnel 100 via the information from the TCP and UDP connection interfaces ("sockets") of the tunnel 100. For example, in a Linux 2.6 system, an API (for "Application Programming Interface") interface called the "TCP_INFO socket option" makes it possible to request information on the state of the TCP connection (losses, RTT, congestion window, etc.). In addition, the transmitting block 410 can obtain certain transport statistics on its UDP carrier 100B by exchanging information with the receiving block 420 (number of packets received, equivalent RTT on UDP, lack of scheduling, etc.).

Then, in a step 912, the actions shown with respect to the step 500 of FIG. 5 are executed in order to determine the number of packets that can be inserted into the carrier without degradation of the end-to-end bit rate of the passenger applications of the tunnel. This margin that remains, that is to say that is not used by the streams during transmission on the TCP carrier 100A, will subsequently be marked "Minst" and is such that:

$$Minst=FWS/MSS$$

In an embodiment of the present invention in which several streams are transmitted from the transmitting block 410 to the receiving block 420, the remaining margin Minst is then shared between these various streams. Various rules for distributing the remaining margin Minst between these different streams may be used. For example, the remaining margin Minst may be distributed equally between the various streams. Other distributions, for example according to criteria of importance of streams from the point of view of the user, may also be applied.

In a conventional manner, a correcting code must be such that the percentage of parity packets relative to the number of packets of the stream 401 is at least equal to the percentage loss on the network (as represented by a packet error rate or PER). Therefore, a test 913 is applied to verify that the encoding window size value K, in view of the number Minst identifying the remaining margin in the congestion window of the TCP carrier 100A, makes it possible to correct the instantaneous losses.

In the event of a positive verification, a test 914 is conducted in order to determine whether the packet error rate PER on the tunnel 100 has reduced. If it has, it means that the conditions of transmission via the tunnel 100 have improved and that the redundancy provided by the parity packets may be reduced. In a step 915, the parameters K and M are chosen so as to compensate for the packet error rate on the tunnel 100: K must be less than or equal to Knom and M must be less than the remaining margin Minst in the congestion window "cwnd" of the TCP carrier 100A.

If the test 914 is negative, in a step 916, the new value Minst is assigned to the parameter M.

If the test 913 shows that the current parameters of K and Minst do not make it possible to correct the losses on the tunnel 100, then the value Minst is assigned to the parameter M in a step 917, because Minst corresponds to the maximum number of additional packets allowed on the TCP carrier 100A without degrading the transport of the other passenger streams carried by the TCP carrier 100A.

A test is then made, in a step 918, to ascertain whether M is zero. If it is, it means that no parity packet can be transported via the TCP carrier, so the algorithm stops. Otherwise, a step 919 is executed in order to modify the parameter K so as to compensate for the error rate on the tunnel 100 according to the remaining margin Minst in the congestion window "cwnd" of the TCP carrier 100A. The parameter K is chosen such that:

$$(M/K) \geq PER$$

Preferably, the value of the parameter K must not be too low relative to the latency of transmission on the TCP carrier. Specifically, it must be ensured that the M packets transmitted on the TCP carrier 100A reach the tunnel end point 102 shortly after the K packets (corresponding to the M parity packets) transmitted on the UDP carrier 1008. The lower the parameter K, the more parity packets are transmitted on the TCP carrier 100A. The TCP carrier 100A must therefore support a transmission bit rate of M parity packets close to the bit rate of the K packets of the stream 401 transmitted on the UDP carrier 100B. This leads to defining a minimal value Kmin of the parameter K:

$$K\min=M*\text{rate}\_401/(\text{rate}\_TCP*PER)$$

If the determination of the parameter K leads to a value smaller than Kmin, then no correction is possible with the current conditions. In this case, the parameter K is retained and the parameter M is set to 0 to indicate that there is no application of correcting code.

In a first preferred embodiment that is more particularly appropriate to an error-correcting code based on use of EXCLUSIVE-ORs (XORs), if the value of the parameter K is determined to be lower than the value Kmin, this determined value is denoted K', the value Kmin is assigned to the parameter K. The value K' is used in the step 805 of FIG. 8 in order to apply the error-correcting code only to a limited number K' of packets from the K packets of the encoding window (K'<K).

In a second preferred embodiment more particularly appropriate to a Reed-Solomon error-correcting code, if the value of the parameter K is determined to be lower than the value Kmin, the value Kmin is assigned to the parameter K, and a new number M of parity packets is determined in order to ensure the correction. Then, since M>Minst, it is decided in this instance to occupy more space on the TCP carrier 100A in order to ensure a correction of the errors sustained on the UDP carrier 1008.

In a step 920, the parameters M, K and if necessary K' are supplied to the encoding module 415.

If the parameters M and K change over time, it becomes necessary to change the parity matrix, particularly in the context of use of a Reed-Solomon correcting code. These matrices may be determined dynamically according to the change in the transmission conditions, or be predefined and stored in memory in the tunnel end points 101 and 102, with, as corresponding elements, the transmission conditions to which each of the predefined matrices corresponds.

It is then advantageous not to unnecessarily modify the parity-encoding parameters. Therefore, in a variant embodiment of the steps 915 and 919, a value M that is slightly greater than Minst is taken into account. This situation provides an operating margin which makes it possible to respond rapidly to an increase in the packet error rate on the tunnel 100, without modifying the parameters of the error-correcting code (particularly advantageous in the case of a Reed-Solomon error-correcting code).

A value marked M' (M'>M) is provided as an additional parameter to the encoding module 415 and is used for the application of the error-correcting code. Only M parity packets are then transmitted via the TCP carrier 100A out of the number M' of parity packets created. This makes it possible to preserve the current (or previous) parameters of the error-correcting code and this therefore avoids having to reconfigure the encoding module 415 (which would require a new parity matrix in the context of a Reed-Solomon error-correcting code for example). Therefore, if there is an increase in the packet error rate on the tunnel (that is to say on the Internet network), the current parameters of the error-correcting code remain suitable to the new transmission conditions. It is also possible to define the parameter M' as being a value of the parameter M determined at a given time and according to given transmission conditions, to which a safety margin is applied, thereby authorizing fluctuations in the transmission conditions without changing the effective parameters applied by the encoding module 415.

Although the present invention has been described in conjunction with certain embodiments, it is to be understood that modifications and variations may be made without departing from the spirit and scope of the invention as will be evident to those skilled in the art. Such modifications and variations are considered to be within the scope of the invention and the appended claims.

What we claim is:

1. A transmission method for transmitting a data stream from a transmitting device to a receiving device via a communication network, wherein data of the data stream is transmitted to the receiving device by using a transport protocol without acknowledgement to user data, the transmission method comprising:
   determining, via the transmitting device, parity-encoding parameters for parity encoding a data set of the data stream;
   generating, via the transmitting device, parity data from the data set by using the determined parity-encoding parameters; and
   transmitting, via the transmitting device, the generated parity data to the receiving device via the communication network by using a transport protocol with data acknowledgement to parity data.

2. The transmission method according to claim 1, wherein the parity-encoding parameters are determined according to an item of information concerning a congestion of the communication network.

3. The transmission method according to claim 2, wherein the parity-encoding parameters are determined according to a congestion window of the transport protocol with data acknowledgement to parity data.

4. The transmission method according to claim 3, wherein a quantity of generated parity data from the parity-encoding parameters is equal to a margin remaining in the congestion window.

5. The transmission method according to claim 1, wherein an encoding window is defined on the data stream and one of the determined parity-encoding parameters corresponds to a selection of the data set amongst the encoding window.

6. The transmission method according to claim 5, further comprising supplying, via the transmitting device, the receiving device with an indication of the encoding window and of data of the encoding window used for generating the parity data.

7. The transmission method according to claim 5, further comprising:
   determining, via the transmitting device, a value of margin remaining in a congestion window of the transport protocol with acknowledgement to parity data; and
   adjusting, via the transmitting device, a size of the encoding window according to the determined value of remaining margin.

8. The transmission method according to claim 7, further comprising modifying the size of the encoding window according to a change in a transmission loss rate between the transmitting device and the receiving device.

9. The transmission method according to claim 1, further comprising:
   determining new parity-encoding parameters of the data set of the data stream, according to a new item of information concerning congestion of the communication network; and
   generating parity data from the data set by using previous parity-encoding parameters, wherein, if a new quantity of parity data resulting from the generating according to new parity-encoding parameters is smaller than a previous quantity of parity data resulting from a generating according to the previous parity-encoding parameters, then the method further comprises:
   generating parity data from the data set by using previous parity-encoding parameters, wherein, if a new quantity of parity data resulting from the generating according to new parity-encoding parameters is smaller than a previous quantity of parity data resulting from a generating according to the previous parity-encoding parameters, then the method further comprises:
   transmitting the selected generated parity data to the receiving device via the communication network by using the transport protocol with data acknowledgement to parity data.

10. The transmission method according to claim 1, wherein generating the parity data comprises one of:
    applying a Reed-Solomon correcting code to a selected set; and
    applying an exclusive-or operation to data of a selected set.

11. The transmission method according to claim 1, further comprising:
    using a tunnel between the transmitting device and the receiving device;
    transporting the data of the data stream via a carrier without acknowledgement of the tunnel; and
    transporting the parity data via a carrier with acknowledgement of the tunnel.

12. A transmission method for transmitting a data stream from a transmitting device to a receiving device via a communication network, wherein data of the data of the data stream is transmitted to the receiving device by using a transport protocol without data acknowledgement to user data, the transmission method comprising:
    obtaining, via the receiving device, parity-encoding parameters of a data set of the data stream;
    receiving, via the receiving device, parity data via the communication network, by using a transport protocol with data acknowledgement to parity data; and
    obtaining, via the receiving device, the data set from data of the data stream received by using the transport protocol without acknowledgement to user data and the parity data received by using the transport protocol with data acknowledgement to parity data.

13. A non-transitory computer readable medium storing a program adapted to be executed on a computer in a transmitting device that transmits a data stream to a receiving device via a communication network, wherein data of the data stream is transmitted to the receiving device by using a transport protocol without acknowledgement to user data, wherein the program, when executed, causes the transmitting device to perform a transmission method comprising:
    determining parity-encoding parameters for parity encoding a data set of the data stream;
    generating parity data from the data set by using the determined parity-encoding parameters; and transmitting the generated parity data to the receiving device via the communication network; by using a transport protocol with data acknowledgement to parity data.

14. A non-transitory computer readable medium storing a program adapted to be executed on a computer in a receiving device that receives a data stream from a transmitting device via a communication network, wherein data of the data stream is transmitted to the receiving device by using a transport protocol without acknowledgement to user data, wherein the program, when executed, causes the receiving device to perform a transmission method comprising:
   obtaining parity-encoding parameters of a data set of the data stream;
   receiving parity data via the communication network, by using a transport protocol with data acknowledgement; and
   obtaining the data set from data of the data stream received by using the transport protocol without data acknowledgement and the parity data received by using the transport protocol with data acknowledgement to parity data.

15. A transmitting device for transmitting a data stream to a receiving device via a communication network, wherein data of the data stream is transmitted to the receiving device by using a transport protocol without acknowledgement to user data, wherein the transmitting device comprises:
   a determining unit that determines parity-encoding parameters for parity encoding a data set of the data stream;
   a generating unit that generates parity data from the data set by using the parity-encoding parameters determined by the determining unit; and
   a transmitting unit that transmits the parity data generated by the generating unit to the receiving device via the communication network by using a transport protocol with data acknowledgement to parity data.

16. The transmitting device according to claim 15, wherein the determining unit determines the parity-encoding parameters according to an item of information concerning a congestion of the communication network.

17. The transmitting device according to claim 15, wherein a tunnel is set up between the transmitting device and the receiving device and the transmitting device comprises:
   a first transmitter that transmits the data of the data stream via a carrier of the tunnel using the transport protocol without acknowledgement to user data; and
   a second transmitter that transmits the parity data via a carrier of the tunnel using the transport protocol with data acknowledgement to parity data.

18. A receiving device for receiving a data stream from a transmitting device via a communication network, wherein data of the data stream is transmitted to the receiving device by using a transport protocol without acknowledgement to user data, wherein the receiving device comprises:
   a parameter obtaining unit that obtains parity-encoding parameters of a data set of the data stream;
   a receiving unit that receives parity data via the communication network by using a transport protocol with data acknowledgement to parity data; and
   a data set obtaining unit that obtains the data set from data of the data stream received by using the transport protocol without acknowledgement to user data and the parity data received by using the transport protocol with data acknowledgement to parity data.

* * * * *